United States Patent [19]
Kang et al.

[11] Patent Number: 5,278,441
[45] Date of Patent: Jan. 11, 1994

[54] METHOD FOR FABRICATING A SEMICONDUCTOR TRANSISTOR AND STRUCTURE THEREOF

[75] Inventors: Young-Tae Kang, Ahnyang; Rae-Ku Kang, Seoul; Byoung-Hyeok Nho, Shiheung, all of Rep. of Korea

[73] Assignee: SamSung Electronics Co. Ltd., Kyungki, Rep. of Korea

[21] Appl. No.: 684,795

[22] Filed: Apr. 15, 1991

[30] Foreign Application Priority Data

Feb. 27, 1991 [KR] Rep. of Korea ................. 1991-3186

[51] Int. Cl.⁵ .................... H01L 27/02; H01L 21/265
[52] U.S. Cl. ................................. 257/371; 257/336; 257/338; 257/346; 257/387; 257/408; 257/900; 437/34; 437/41; 437/57; 437/913; 437/984
[58] Field of Search ............... 357/23.4, 23.9, 42; 257/336, 338, 346, 371, 387, 408, 900; 437/34, 41, 57, 913, 984

[56] References Cited

U.S. PATENT DOCUMENTS

| | | | |
|---|---|---|---|
| 4,949,136 | 8/1990 | Jain | 257/374 |
| 4,985,744 | 1/1991 | Spratt et al. | 357/23.9 |
| 5,021,353 | 6/1991 | Lowry et al. | 357/42 |
| 5,091,763 | 2/1992 | Sanchez | 257/346 |

*Primary Examiner*—Edward Wojciechowicz
*Attorney, Agent, or Firm*—Robert E. Bushnell

[57] ABSTRACT

A method for fabricating a CMOS field effect transistor with LDD (light doped drain) structure is disclosed. A first gate for an NMOS transistor and a second gate for a PMOS transistor are formed on a semiconductor substrate, and the NMOS and PMOS transistor regions are subjected to different ion implantation processes so as to form a first source and drain of low concentration. After forming a first spacer on the side walls of the gates, the substrate is subjected to another ion implantation so as to form a second source and drain of high concentration for the NMOS transistor. After forming a second spacer on the side surfaces of the first spacers, the substrate is subjected to still another ion implantation so as to form a second source and drain of high concentration for the PMOS transistor. Then is obtained a CMOS transistor provided with a PMOS transistor of LDD structure without increasing the diffusion resistance of an NMOS transistor.

36 Claims, 4 Drawing Sheets

METHOD FOR FABRICATING A SEMICONDUCTOR TRANSISTOR AND STRUCTURE THEREOF

TECHNICAL BACKGROUND

The present invention relates to a method for fabricating a CMOS (Complementary Metal Oxide Semiconductor) field effect transistor with LDD (lightly doped drain) and structure thereof.

The channel length of a MOS field effect transistor (herein referred to as MOS transistor) has been continuously shortened so as to achieve a more highly integrated semiconductor circuit. As a result the electric field tends to be concentrated in the drain, so as to generate hot carriers, which are introduced into the gate. Thus they causes, so-called hot carrier effect, the undesired effect that the hot carriers make the threshold voltage of the transistor unstable, etc.

In order to obviate the hot carrier effect, an insulated spacer is formed on the side walls of the gate by reactive ion etching, so as to obtain a lightly doped drain (LDD) by implanting the same conduction impurity as that of the source and drain into the source and drain in the semiconductor at low concentration.

Referring to FIG. 1, is illustrated a conventional CMOS transistor comprising a PMOS transistor and NMOS transistor formed in one and the same semiconductor substrate.

There are adjacently formed a p-well 4 and n-well 6 on an n-type or p-type semiconductor substrate 2. The p-well 4 and n-well 6 are electrically isolated from each other by a field oxide layer 8. A first source and drain 18, 19 of low concentration are separated by a channel region in the p-well 4. A second source and drain 20, 21 of high concentration are separated with a more distance than the distance between the first source and drain. Over the channel region is formed a gate insulated layer 10, on which is there formed a first gate 12. An oxide layer spacer 16 with a first width is formed on both side walls of the gate 12.

On the other hand, a source and drain 22, 23 are separated by a channel region in the n-well 6. Over the channel region is formed a gate insulated layer 10, on which is there formed a second gate 14. An oxide layer spacer 16 of the first width is formed on both side walls of the gate 14.

The LDD structure such as formed in the well 4 is achieved by a method comprising the steps of forming the first source and drain regions by performing first ion-implantation to the whole surface of a substrate having a gate pattern, and of forming the second source and drain regions of high concentration by performing second ion-implantation to the whole surface of the substrate after forming a spacer on both side walls of the gate.

However, in such a PMOS transistor formed in the n-well, it is difficult to distinguish the low concentration ion-implanted region and high concentration ion-implanted region from each other because of very large out-diffusion of the ion-implanted p-type impurity. Namely, if the ion-implantation for obtaining a high concentration diffusion region is performed after simultaneously forming the spacers of the NMOS and PMOS transistors, the p-type impurity becomes diffused to a distance corresponding to about the width of the spacer, thereby resulting in a single drain (SD) structure.

Referring to FIG. 2, is illustrated another conventional semiconductor transistor obtained by using the same method as in FIG. 1.

There are adjacently formed a p-well 24 and n-well 26 on an n-type or p-type semiconductor substrate 22. The p-well 24 and n-well 26 are electrically isolated from each other by a field oxide layer 28. A first source and drain 38, 39 of low concentration are separated by a channel region in the p-well 24. A second source and drain 40, 41 of high concentration are separated with a more distance than the distance between the first source and drain. Over the channel region is formed a gate insulated layer 30, on which is there formed a first gate 32. An oxide layer spacer 36 of a first width is formed on both side walls of the gate 32.

On the other hand, a first source and drain 42, 43 are separated by a channel region in the n-well 26. A second source and drain 44, 45 of high concentration respectively cover the first source and drain 42, 43. Over the channel region is formed a gate insulated layer 30, on which is there formed a second gate 34. An oxide layer spacer 36 of the first width is formed on both side walls of the gate 34.

However, in this PMOS transistor formed in the n-well 26 as shown in FIG. 2, if the distance of the p-type impurity exceeds the width of the spacer 36, the ion-implanted regions 44, 45 of high concentration cover the ion-implanted regions 42, 43 of low concentration.

Referring to FIG. 3 for illustrating another conventional semiconductor transistor, the width of the spacer is increased considering the out-diffusion of the p-type impurity.

There are adjacently formed a p-well 44 and n-well 46 on an n-type or p-type semiconductor substrate 42. The p-well 44 and n-well 46 are electrically isolated from each other by a field oxide layer 48. A first source and drain 58, 59 of low concentration are separated by a channel region in the p-well 44. A second source and drain 60, 61 of high concentration are separated with a more distance than the distance between the first source and drain. Over the channel region is formed a gate insulated layer 50, on which is there formed a first gate 52. An oxide layer spacer 56 of a first width is formed on both side walls of the gate 52.

The width of the spacer 56 contacting with the gate insulated layer 50 is about 2500Å. In this case, although a PMOS transistor with LDD structure is obtained by sufficiently increasing the width of the spacer 56 so as to compensate for the adverse excessive diffusion of the p-type impurity, the increased width of the spacer 56 increases the diffusion resistance between the source and drain of the NMOS transistor so as to result in decrease of the drain current.

Thus, the PMOS and NMOS transistor regions of the conventional semiconductor transistor may not have the desired LDD structure, because each of the regions is subjected to the ion-implantation after simultaneously forming the spacers of both regions.

SUMMARY OF THE INVENTION

The object of the present invention is to provide a method for fabricating a semiconductor transistor and structure thereof, whereby a PMOS transistor of LDD structure is formed without increasing the diffusion resistance between the source and drain of an NMOS transistor.

According to the present invention, the ions of low concentration are implanted into each of the region of the NMOS and PMOS transistors in which there have been already formed the gates, and then a first spacer is formed on the side walls of the gates before implanting the ions of high concentration into the NMOS transistor region. Next, a second spacer is formed on the side surfaces of the first spacers before implanting the ions of high concentration into the PMOS transistor region.

The present invention will now be described more specifically with reference to the drawings attached only by way of example.

BRIEF DESCRIPTION OF THE ATTACHED DRAWINGS

DETAILED DESCRIPTION OF PREFERRED EMBODIMENTS

Figure 1:
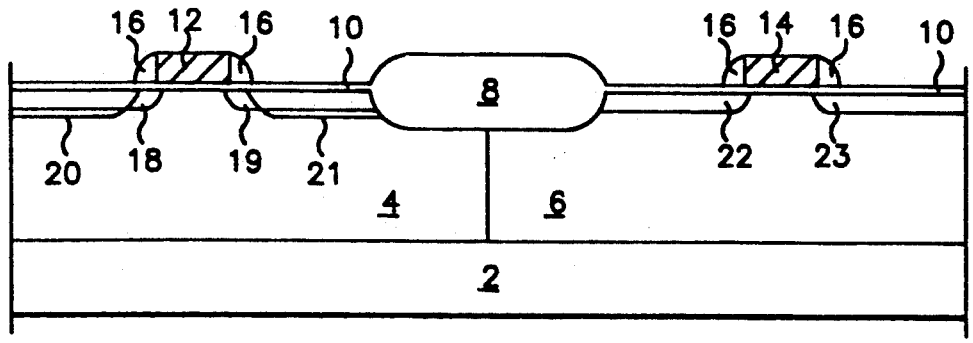
FIG. 1 is a cross sectional view of a conventional semiconductor transistor.
Figure 2:
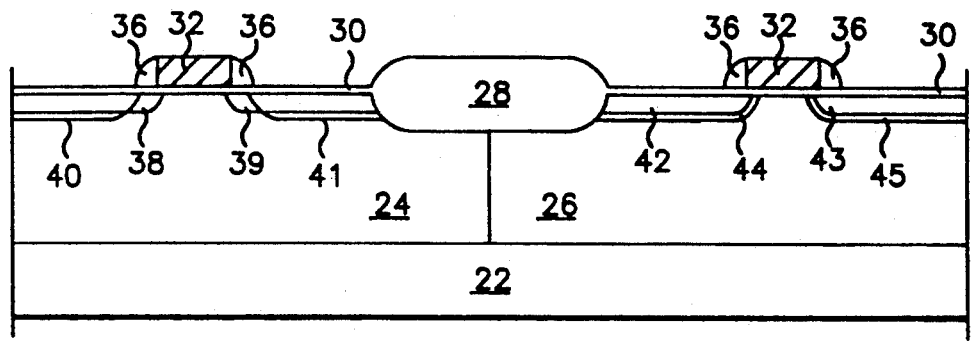
FIG. 2 is a similar view to FIG. 1 of another conventional semiconductor transistor.
Figure 3:
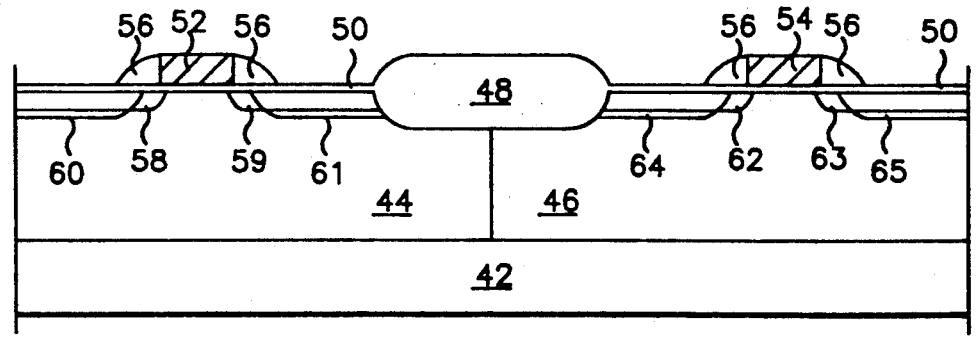
FIG. 3 is another similar view to FIG. 1 of a further conventional semiconductor transistor.
Figure 4:
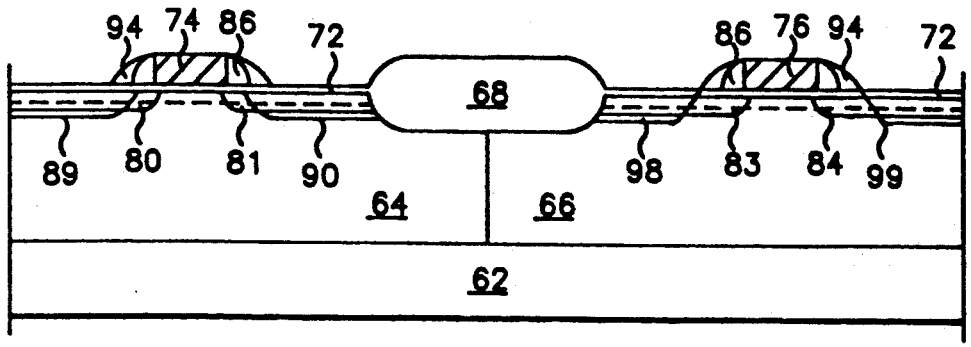
FIG. 4 is a cross sectional view of the inventive semiconductor transistor.

Referring to FIG. 4 for illustrating the inventive semiconductor transistor, there are adjacently formed a p-well 64 and n-well 66 on an n-type or p-type semiconductor substrate 62. The p-well 64 and n-well 66 are electrically isolated from each other by a field oxide layer 68. A first source and drain 80,81;83,84 of low concentration are separated by a channel region in the p-well 64 and n-well 66. Over the channel region are formed an insulated gate layer 72, on which are there formed a first and second gates 74,76. A first and second spacers 86,94 are formed on the side walls of the gates. A second source and drain 89, 90 are formed in the n-well 64 with a distance, being limited by the width of the first spacer 86, between the side of the first source and drain 80, 81. Another second source and drain 98, 99 are formed in the p-well with a distance, being limited by the whole width of the first and second spacers 86, 94, between the side of the first source and drain 83, 84.

The inventive method for fabricating a semiconductor transistor will now be described with reference to FIGS. 5A–5G, in which the same reference numerals are used for the parts corresponding to those of FIG. 4.

A p-type semiconductor substrate doped with a p-type impurity at a concentration of 5E13 ions/cm$^3$ and having a crystal orientation of (100) is used as a starting material in the present embodiment, though there may be used an n-type semiconductor substrate.

Figure 5A:
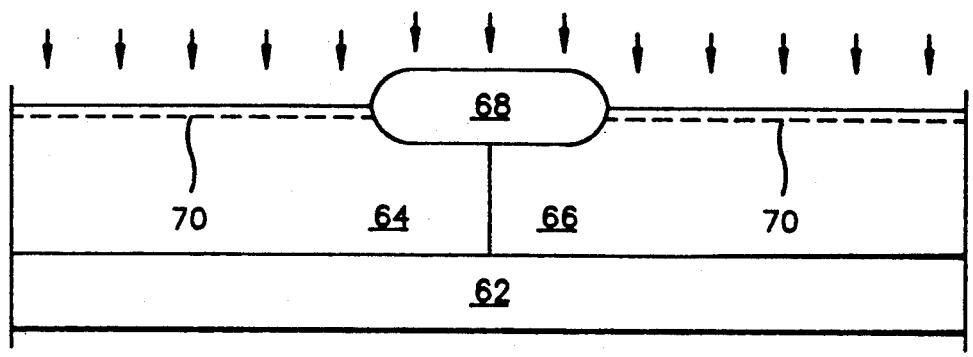
FIG. 5A to 5G illustrate the steps of inventive method.

Referring to FIG. 5A, the p-well and n-well regions are defined in the substrate 62 by different etching processes, and then the ion-implantation is performed to form the p-well 64 and n-well 66. In this case, the p-type and n-type impurities are implanted at the dose of 2E13 ions/cm$^2$ with the energy of 80 to 100 KeV. Thereafter a field oxide layer 68 is formed by selective oxidation in the boundary region of the p-well 64 and n-well 66. The thickness of the field oxide layer 68 is preferably within the range of 3000–3500Å.

In order to adjust the threshold voltage, the p-type impurity is implanted at the dose of 1E12 ions/cm$^2$ with the energy of 30 KeV. As a result, a p-type ion implanted region 70 is formed near the surface of the substrate 62.

Figure 5B:
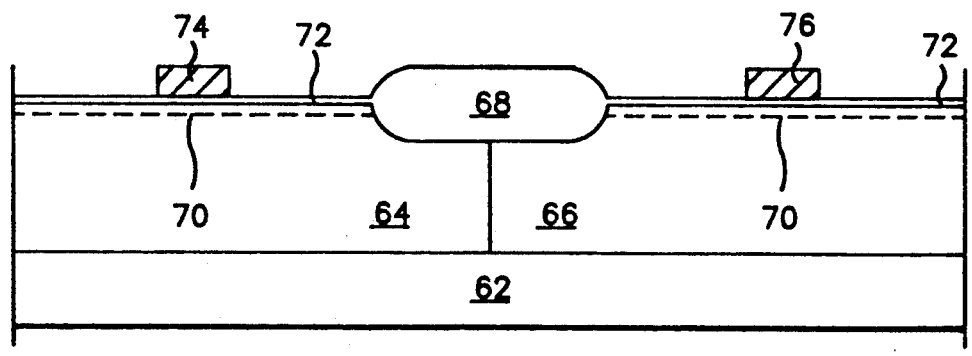

A gate insulated oxide layer 72 with a thickness of 80–100Å is formed on the whole surface of the substrate 62 by thermal oxidation, as shown in FIG. 5B. Then the whole surface of the substrate is deposited by polycrystalline silicon of 2000Å, and doped with POCl$_{33}$, etc. Then the first and second gates 74, 76 are formed by patterning of photolithography.

Figure 5C:
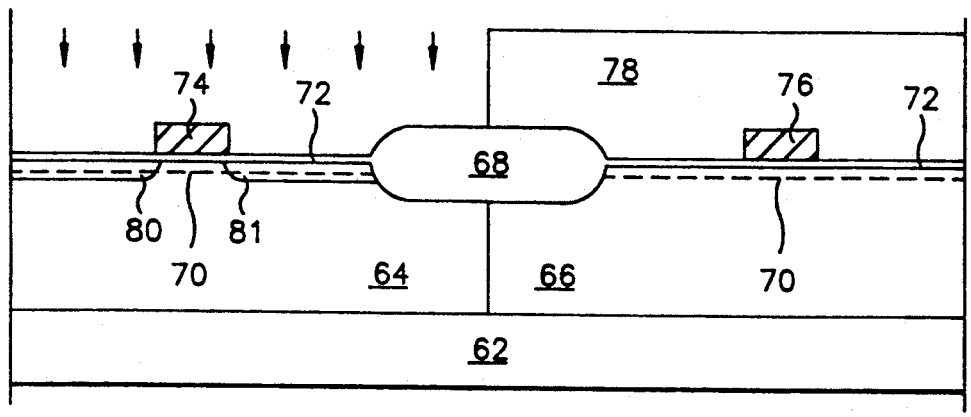

Referring to FIG. 5C, a first photoresist 78 is formed on the upper surface of the n-well 66, and then the n-type impurity is implanted into the whole surface of the substrate at the dose of 2.4E13 ions/cm$^2$ with the energy of 40 KeV so as to form the first source and drain 80, 81 of the NMOS transistor on the substrate except under the first gate 74.

Figure 5D:
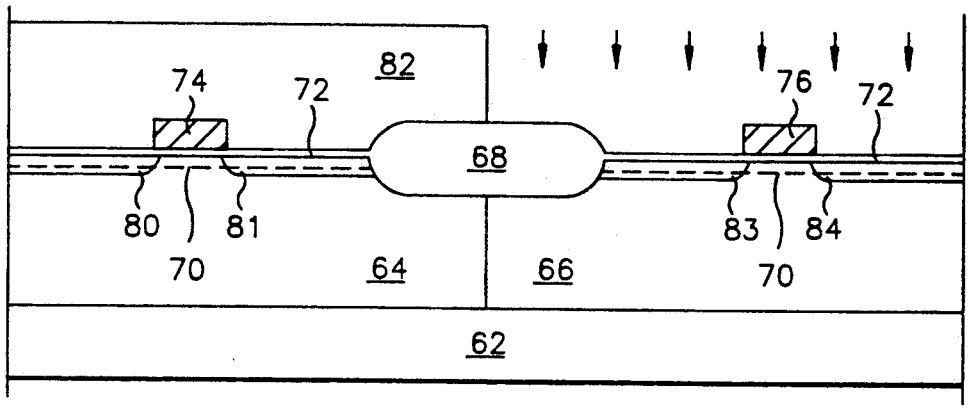

Referring to FIG. 5D, after the photoresist 78 is removed, a second photoresist 82 is formed on the p-well 64, and then the p-type impurity is implanted into the whole surface of the substrate 62 at the dose of 2E13 ions/cm$^2$ with the energy of 30 KeV so as to form the first source and drain 83, 84 of the PMOS transistor.

Figure 5E:
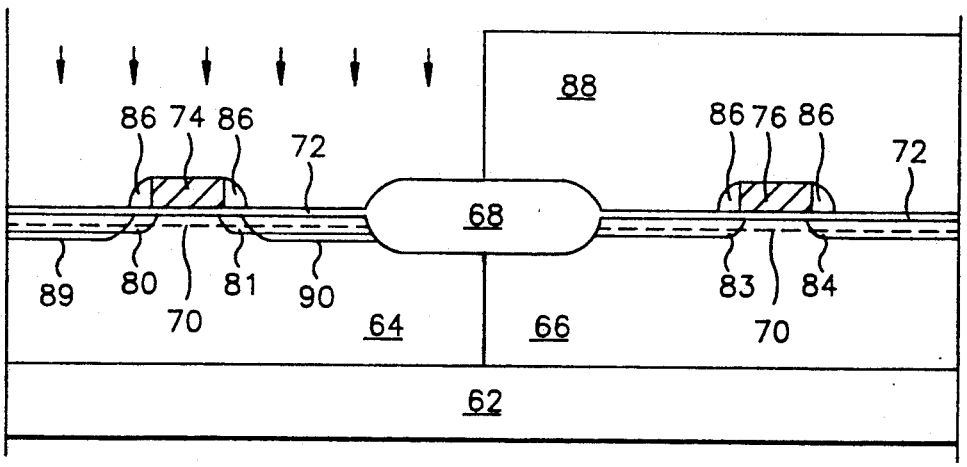

Referring to FIG. 5E, after the second photoresist 82 is removed, a silicon oxide layer of 1000–1300Å is formed on the whole surface of the substrate 62. Then the substrate is subjected to the reactive ion etching to form a first oxide layer spacer 86 on the side walls of the gates. Thereafter a third photoresist 88 is formed on the upper surface of the n-well 66, and then the n-type impurity is implanted into the whole surface of the substrate at the dose of 5E15 ions/cm$^2$ with the energy of 40 KeV so as to form the second source and drain 89, 90 of the NMOS transistor on the substrate except under the first gate 74 and first oxide layer spacer 86.

Figure 5F:
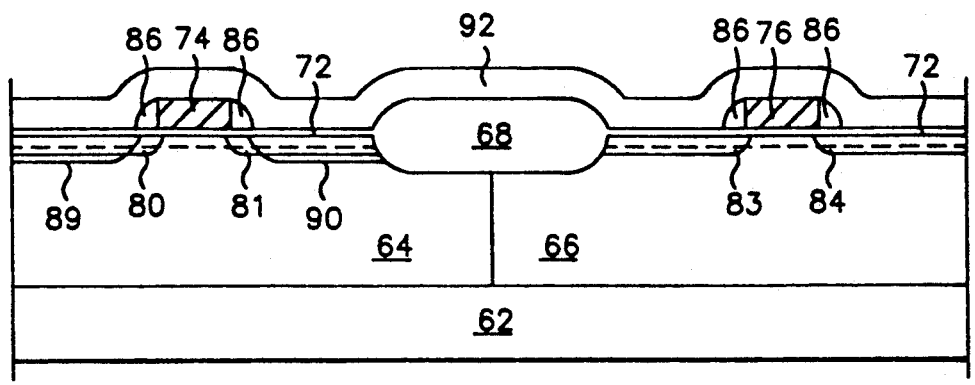

After the third photoresist 88 is removed, the whole surface of the substrate 62 is covered with a silicon oxide layer 92 of the thickness of 1000–1500Å, as shown in FIG. 5F.

Figure 5G:
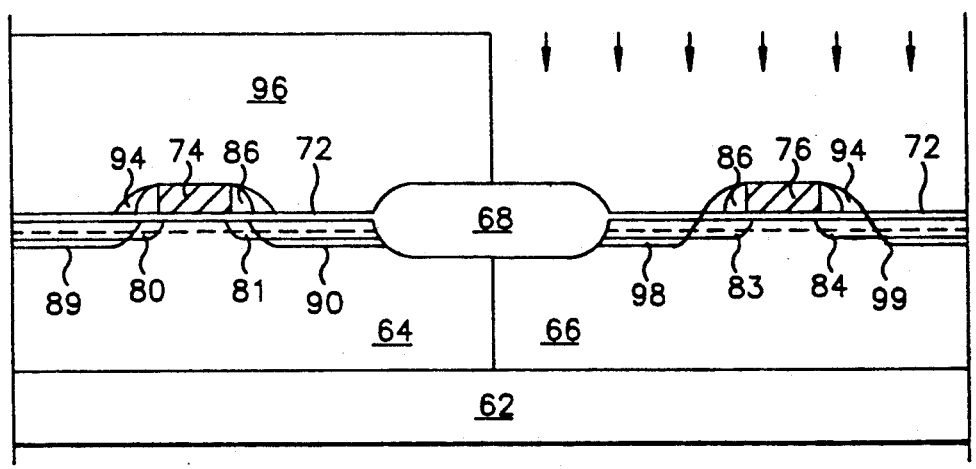

Referring to FIG. 5G, a second oxide layer spacer 94 is formed on the side surfaces of the first oxide layer spacers 86 by the reactive ion etching. Then a fourth photoresist 96 is formed on the upper surface of the p-well 64, and the p-type impurity is implanted into the whole surface of the substrate at the dose of 5E15 ions/cm$^2$ with the energy of 40 KeV.

In general diffused distance of side surface in doped region by the heat treatment is about 0.75 times of finally diffused depth. Therefore an ion-implantation process makes whole width be larger than 0.75 times of the finally diffused depth, wherein the whole width is defined by both the first oxide spacer 86 and the second oxide spacer 94. Thus, even if the ion-implanted p-type impurity is diffused during the heat treatment, the desired PMOS transistor of LDD structure is obtained, because the whole width of the first and second oxide layer spacers 86, 94 formed by the two processing steps is much greater than the diffusion distance of the p-type impurity.

Figure 6:
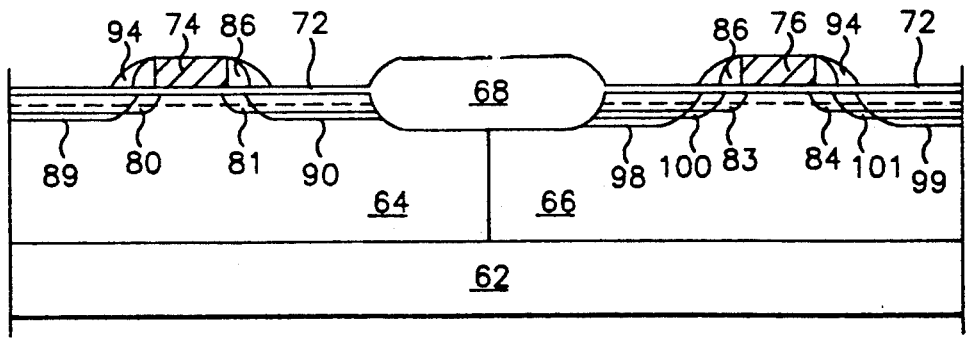
FIG. 6 is a cross sectional view of a semiconductor transistor according to another embodiment of the present invention.

FIG. 6 illustrates a cross sectional view of another embodiment of the inventive semiconductor transistor, wherein the same reference numerals are used for the parts corresponding with FIGS. 4 and 5.

In the embodiment of FIGS. 4 and 5, the first source and drain 83, 84 are formed after forming the gate 76, and the second source and drain 98, 99 are formed after forming the second oxide layer spacer 94, so as to obtain the LDD structure in the PMOS transistor.

However, in the embodiment of FIG. 6, a further ion implantation of the p-type impurity is provided after forming the first spacer 86, so as to form a third source and drain 100, 101 with a concentration between those of the first and second sources and drains, thus obtaining a diffusion region of triple structure concerning concentration in the PMOS transistor. At this time, dose is about 5E14 ions/cm$^2$.

Moreover, the first source and drain region of the PMOS transistor may be formed after forming the gate or the first spacer.

When making the triple structure in the PMOS transistor as shown in FIG. 6 and forming the first source and drain region by subjecting the first spacer to the ion-implantation, the width of the second spacer must be larger than diffused distance of the P-type impurity.

As described above, each of the NMOS and PMOS transistors may have the diffusion region of desired LDD structure by the processing steps of performing the first ion implantation for forming the second source and drain of the NMOS transistor after forming the first spacer, and then performing the second ion implantation for forming the second source and drain of the PMOS transistor after forming the second spacer, according to the present invention. Furthermore, the PMOS transistor with LDD structure may be obtained without the diffusion resistance of the NMOS transistor.

Besides the punch through effect is prevented by the PMOS transistor of LDD structure, so that the size of the PMOS transistor can be reduced, and thus the operating speed can be increased.

What is claimed is:

1. A method for fabricating a semiconductor transistor having a first transistor region of first conduction type and a second transistor region of second conduction type provided in the first or second conductive type semiconductor substrate, said method for fabricating a semiconductor transistor comprising the steps of:
   implanting impurity ions of the second and first conduction type respectively into said first and second transistor regions so as to respectively form first and second concentration diffusion regions, after forming first and second gate respectively on said first and second transistor regions with a gate insulated layer interposed therebetween;
   forming a first insulated spacer on both side walls of each of said gates;
   performing an ion implantation of the second conduction type impurity so as to form third concentration diffusion regions after subjecting only said first transistor region;
   forming a second insulated spacer on both side walls of each of said first insulated spacers; and
   performing an ion implantation of the first conduction type impurity so as to form fourth concentration diffusion regions after subjecting only said second transistor region.

2. The method for fabricating a semiconductor transistor as claimed in claim 1, wherein the first and second conduction type is respectively p-type and n-type.

3. The method for fabricating a semiconductor transistor as claimed in claim 2, wherein said third and fourth concentration diffusion regions have concentrations of ions respectively higher than the concentration of ions of said first and second concentration diffusion regions.

4. The method for fabricating a semiconductor transistor as claimed in claim 3, wherein the interval between an edge of said first concentration diffusion regions and an adjacent edge of said third concentration diffusion regions is limited by the width said first insulated spacer, and the interval between an edge of said second concentration of diffusion regions and an adjacent edge of said fourth concentration diffusion regions is limited by the whole width of both said first insulated spacer and said second insulated spacers.

5. The method for fabricating a semiconductor transistor as claimed in claim 4, wherein said whole width is larger than about 0.75 times of finally diffused depth of said fourth concentration regions.

6. The method for fabricating a semiconductor transistor as claimed in claim 2, further comprising a step of subjecting only said second transistor region to ion-implantation, prior to said step of forming a second insulated spacer, of the first conduction type impurity having a concentration of ions between the concentration of ions of said second concentration diffusion regions and the concentration of ions of said fourth concentration diffusion regions so as to form three concentration diffusion regions diffused with different concentrations in said second transistor.

7. The method for fabricating a semiconductor transistor as claimed in claim 2, wherein the ion implantation step for forming said second concentration diffusion regions of the first transistor regions is performed after forming said first insulated spacer.

8. The method for fabricating a semiconductor transistor as claimed in claim 6, wherein the width of said second insulated spacer is larger than about 0.75 times a finally diffused depth of said fourth concentration diffusion regions.

9. The method for fabricating a semiconductor transistor as claimed in claim 1, wherein said gate insulated layer is an oxide layer.

10. The method for fabricating a semiconductor transistor as claimed in claim 1, wherein said first and second insulated layer, each having a given thickness, are formed on said substrate in response to reactive ion etching.

11. The method for fabricating a semiconductor transistor as claimed in claim 1, wherein said first and second insulated layer spacer are selected from the group comprising of an oxide layer and a nitride layer.

12. The method for fabricating a semiconductor transistor as claimed in claim 1, wherein said gates are formed of a first or second conduction type polycrystalline silicon or metal.

13. A semiconductor transistor having a first transistor with second conduction type diffusion regions separated a given interval by a first channel and formed in a first conduction type semiconductor substrate well, and formed with a gate formed over said first channel, and a second transistor with first conduction type diffusion regions separated by a given interval by a second channel and formed in a second conduction type semiconductor substrate well and with a gate formed over said second channel, said semiconductor transistor comprising:
   a first insulated oxide spacer formed on each of the side walls of said gates of said first and second transistors;

a second insulated oxide spacer formed on each of the side walls of said first insulated oxide spacer of each of said gates;

first and second concentration diffusion regions included in the diffusion regions of said first transistor, an interval between an edge of said first concentration diffusion regions and an adjacent edge of said second concentration diffusion regions being limited by a width of said first insulated oxide spacer; and third and fourth concentration diffusion regions included in the diffusion regions of said second transistor, an interval between an edge of said third concentration diffusion regions and an adjacent edge of said fourth concentration diffusion regions being limited by the whole width of said first and second insulted oxide spacers.

14. The semiconductor transistor as claimed in claim 13, wherein said first and second conduction type is respectively p-type and n-type.

15. The semiconductor transistor as claimed in claim 13, wherein ion concentrations of said first and third concentration diffusion regions are respectively lower than the ion concentrations of said second and fourth concentration diffusion regions.

16. The semiconductor transistor as claimed in claim 14, wherein the whole width defined by both said first insulated oxide spacer and said second insulated oxide spacer is larger than about 0.75 times of finally diffused depth of said fourth concentration diffusion regions.

17. The semiconductor transistor as claimed in claim 14, further comprising fifth concentration diffusion regions, in said second transistor, being formed after said third diffusion regions are formed and before said fourth diffusion regions are formed, and having a distance between an edge of said fifth concentration diffusion regions and an adjacent edge of said fourth concentration diffusion regions limited by thickness of said insecond oxide spacer, said fifth concentration diffusion regions having a concentration of ions between the connection of ions of said third concentration diffusion regions and the concentration of ions of said fourth concentration diffusion regions.

18. The semiconductor transistor as claimed in claim 17, wherein the width defined by said second oxide spacer is larger than about 0.75 times of finally diffused depth of said fourth concentration diffusion regions.

19. A method for fabricating a semiconductor transistor having a first transistor region of first conduction type and a second transistor region of second conduction type provided in one of the first and second conduction type semiconductor substrates, said method for fabricating a semiconductor transistor comprising the steps of:

forming first and second gates respectively on said first and second transistor regions with a gate insulted layer interposed between said substrate and said first gate and between said substrate and said second gate;

implanting impurity ions of the second and first conduction type, respectively, into nonmasked areas of said first and second transistor regions so as to respectively form first and second diffusion regions, after said forming of said first and second gates;

forming a first insulated spacer on both side walls of each of said gates;

performing an ion implantation in said first transistor region of the second conduction type impurity, into areas not masked by said first gate and each said insulated spacer on both side walls of said first gate, so as to form third diffusion regions only in said first transistor region;

forming a second insulated spacer on side walls of each of said first insulated spacers; and performing an ion implantation of the first conduction type impurity into areas not masked by said second gate and each said second and first insulated spacer in said second transistor regions so as to form fourth diffusion regions only in said second transistor region.

20. The method for fabricating a semiconductor transistor as claimed in claim 19, wherein said first and second conduction type is respectively p-type and n-type.

21. The method for fabricating a semiconductor transistor as claimed in claim 20, wherein said third and fourth diffusion regions have concentrations of ions respectively higher than the concentration of ions of said first and second diffusion regions.

22. The method for fabricating a semiconductor transistor as claimed in claim 21, wherein the interval between adjacent edges of said first and third diffusion regions is limited by the width of said first insulated spacer, and the interval between adjacent edges of said second and fourth diffusion regions is limited by the whole width of both said first insulated spacer and said second insulated spacer.

23. The method for of fabricating a semiconductor transistor as claimed in claim 22, wherein said whole width is larger than about 0.75 times of a finally diffused depth of said fourth concentration regions.

24. The method for fabricating a semiconductor transistor as claimed in claim 21, further comprising a step of subjecting only areas in said second transistor region not masked by said second gate and each said first insulated spacer in said second transistor region to ion-implantation prior to said step of forming a second insulated spacer, said ion-implantation being of the first conduction type impurity and having a concentration of ions between the concentration of said second concentration of fourth diffusion regions so as to form three diffusion regions diffused with different concentrations to one another in said second transistor region.

25. The method for fabricating a semiconductor transistor as claimed in claim 20, wherein the ion implantation step for forming said second diffusion region of a the first transistor region is performed after forming said first insulated spacer.

26. The method for fabricating a semiconductor transistor as claimed in claim 24, wherein the width of said second oxide spacer is larger than about 0.75 times a finally diffused depth of said fourth diffusion regions.

27. The method for fabricating a semiconductor transistor as claimed in claim 19, wherein said gate insulated layer is an oxide layer.

28. The method for fabricating a semiconductor transistor as claimed in claim 19, wherein said first and second insulated spacer have a given thickness and are formed on said substrate in response to reactive ion etching.

29. The method for fabricating a semiconductor transistor as claimed in claim 19, wherein said first and second insulated spacers are selected from the group comprised of oxide layer and a nitride layers.

30. The method for fabricating a semiconductor transistor as claimed in claim 19, wherein said gates are selected from the group comprised of a metal and one of a first and a second conduction type polycrystalline silicon.

31. A semiconductor transistor having a first transistor with second conduction type diffusion regions separated by a given interval by a first channel nd formed in a first conduction type semiconductor substrate well, and formed with a gate formed over said first channel, and a second transistor with first conduction type diffusion regions separated by a given interval by a second channel and formed in a second conduction type semiconductor substrate well and with a gate formed over said second channel, said semiconductor transistor comprising:
- a first insulated oxide spacer formed on each of the side walls of said gates of said first and second transistors;
- a second insulted oxide spacer formed on each of the side walls of said first insulated oxide spacer of each of said gates;
- first and second concentrations of ions included in each of the diffusion regions of said first transistor, an interval between an edge of said first concentration of ions and an adjacent edge of said second concentration of ions being limited by a width of said first insulated oxide spacer; and
- a third and fourth concentration of ions included in each of the diffusion regions of said second transistor, an interval between an edge of said third concentration of ions and an adjacent edge of said fourth concentration of ions being limited by the whole width of said first and second insulted oxide spacers.

32. The semiconductor transistor as claimed in claim 31, wherein said first and second conduction type is respectively p-type and n-type.

33. The semiconductor transistor as claimed in claim 31, wherein said first and third concentrations of ions are respectively lower than said second and fourth concentrations of ions.

34. The semiconductor transistor as claimed in claim 32, wherein the whole width defined by both said first insulated oxide spacer and said second insulted oxide spacer is larger than about 0.75 times of finally diffused depth of said fourth consecration diffusion regions of ions.

35. The semiconductor transistor as claimed in claim 32, further comprising another concentration of ions, in each of said diffusion region of said second transistor, and interval between an edge of said another concentration of ions and an adjacent edge of said third concentration of ions being limited by the width of said first insulated oxide spacer and an interval between said edge of said another concentration of ions and an adjacent edge of said fourth concentration of ions being limited by the width of said second insulated oxide spacer.

36. The semiconductor transistor as claimed in claim 35, wherein the width defined by said second oxide spacer is larger than about 0.75 times of a finally diffused depth of said fourth concentration of ions.

* * * * *

UNITED STATES PATENT AND TRADEMARK OFFICE
CERTIFICATE OF CORRECTION

PATENT NO. : 5,278,441  
DATED : January 11, 1994  
INVENTOR(S) : Young-Tae Kang It is certified that error appears in the above-indentified patent and that said Letters Patent is hereby corrected as shown below:

| Column 5, | Line 48, | Change "gate" to --gates-- ; |
| | Line 55, | After "only", Insert --in-- ; |
| | Line 57, | before "side", Delete "both" ; |
| | Line 61, | Delete "after subjecting", After "only" Insert --in-- ; |
| Column 6, | Line 10, | After "concentration", Delete "of" ; |
| Column 8, | Line 12, | Change "regions" to --region-- ; |
| | Line 68, | Change "layer" to --layers-- ; |

UNITED STATES PATENT AND TRADEMARK OFFICE
CERTIFICATE OF CORRECTION

PATENT NO. : 5,278,441
DATED : January 11, 1994
INVENTOR(S) : Young-Tae Kang

It is certified that error appears in the above-indentified patent and that said Letters Patent is hereby corrected as shown below:

Column 9, Line 8, Change "nd" to ---and---;
          Line 12, after "seperated", delet "by"

Signed and Sealed this

Twenty-fifth Day of October, 1994

Attest:

BRUCE LEHMAN

Attesting Officer     Commissioner of Patents and Trademarks